(12) United States Patent
Park et al.

(10) Patent No.: US 10,622,436 B2
(45) Date of Patent: Apr. 14, 2020

(54) DISPLAY DEVICE

(71) Applicant: Samsung Display Co., Ltd., Yongin-si (KR)

(72) Inventors: Jun Hyun Park, Suwon-si (KR); Cheol Gon Lee, Suwon-si (KR); Chong Chul Chai, Seoul (KR); Yang Hwa Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/189,270

(22) Filed: Nov. 13, 2018

(65) Prior Publication Data

US 2019/0148477 A1 May 16, 2019

(30) Foreign Application Priority Data

Nov. 16, 2017 (KR) .................. 10-2017-0153147

(51) Int. Cl.
*H01L 27/32* (2006.01)
*G09G 3/3233* (2016.01)
*G09G 3/3258* (2016.01)
*H01L 27/12* (2006.01)
*G09G 3/3225* (2016.01)

(52) U.S. Cl.
CPC ....... *H01L 27/3276* (2013.01); *G09G 3/3233* (2013.01); *G09G 3/3258* (2013.01); *H01L 27/3248* (2013.01); *H01L 27/3262* (2013.01); *H01L 27/3265* (2013.01); *G09G 3/3225* (2013.01); *G09G 2300/0426* (2013.01); *G09G 2300/0809* (2013.01); *G09G 2300/0819* (2013.01); *G09G 2300/0842* (2013.01); *G09G 2300/0876* (2013.01); *G09G 2320/0209* (2013.01); *H01L 27/124* (2013.01); *H01L 27/1255* (2013.01)

(58) Field of Classification Search
CPC ............. H01L 27/3276; H01L 27/3265; H01L 27/3248; H01L 27/3262; H01L 27/124; H01L 27/1255; G09G 3/3258; G09G 3/3233; G09G 2300/0819; G09G 2300/0426; G09G 2300/0876; G09G 2300/0809; G09G 2320/0209
See application file for complete search history.

(56) References Cited

U.S. PATENT DOCUMENTS

2017/0124941 A1  5/2017  Na et al.
2018/0190197 A1* 7/2018  Chang .................. G09G 3/3233

* cited by examiner

*Primary Examiner* — Thanhha S Pham
(74) *Attorney, Agent, or Firm* — Cantor Colburn LLP

(57) ABSTRACT

A display device includes: an initialization power line extending along a first direction; a scan line extending along the first direction and spaced apart from the initialization power line, a data line and a driving voltage line insulated from the initialization power line and the scan line and extending along the second direction; a first switching element including a first electrode connected to the driving voltage line, a first gate electrode overlapping the initialization power line, and a second electrode; a second switching element including a third electrode connected to the first gate electrode, a second gate electrode connected to the scan line, and a fourth electrode; a third switching element including a fifth electrode connected to the fourth electrode, a third gate electrode connected to the initialization power line, and a sixth electrode connected to the second electrode; and a light emitting element connected to the second electrode.

20 Claims, 11 Drawing Sheets

DR2
DR1

151: 151a, 151b, 151c
152: 152a, 152b, 152c
153: 153a, 153b, 153c
150: 151, 152, 153
T1: 121, 151a, 151b, 151c
T2: 122, 152a, 152b, 152c
T3: 123, 153a, 153b, 153c

120: 121, 122, 123
200: 210, 220, 250
300: 320, 330, 340, 350
500: 510, 530, 550, 570

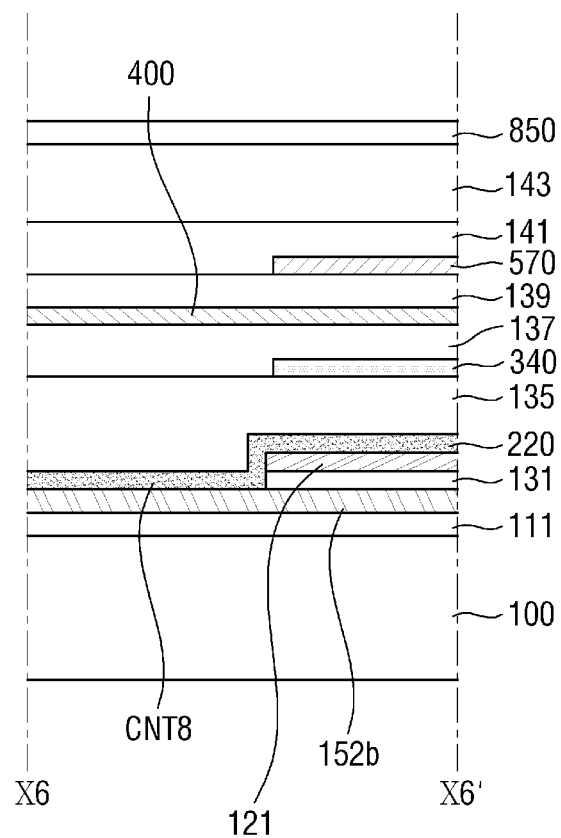

DISPLAY DEVICE

This application claims priority to Korean Patent Application No. 10-2017-0153147, filed on Nov. 16, 2017, and all the benefits accruing therefrom under 35 U.S.C. 119, the content of which in its entirety is herein incorporated by reference.

BACKGROUND

1. Field

The disclosure relates to a display device.

2. Description of the Related Art

Display devices are widely used with the development of multimedia. Accordingly, various types of display device such as a liquid crystal display ("LCD"), an organic light emitting display ("OLED") and the like are used. The OLED typically includes a plurality of pixels, each including an organic light emitting element, which is a self-luminous element. In each pixel, a storage capacitor and a plurality of transistors for driving the organic light emitting element are formed.

SUMMARY

In an organic light emitting display ("OLED"), a plurality of transistors in each pixel may include a driving transistor for driving the organic light emitting element. A voltage change at a node connected to the gate electrode of the driving transistor changes a current flowing to the organic light emitting element, and thus a crosstalk phenomenon, which causes a change in luminance, may occur.

Exemplary embodiments of the disclosure provide a display device with improved display quality in a high-resolution structure.

According to an exemplary embodiment of the invention, a display device includes: an initialization power line extending along a first direction; a scan line extending along the first direction and spaced apart from the initialization power line in a second direction intersecting the first direction, a data line and a driving voltage line which are insulated from the initialization power line and the scan line and extending along the second direction; a first switching element including a first electrode connected to the driving voltage line, a first gate electrode overlapping the initialization power line, and a second electrode; a second switching element including a third electrode connected to the first gate electrode, a second gate electrode connected to the scan line, and a fourth electrode; a third switching element including a fifth electrode connected to the fourth electrode, a third gate electrode connected to the initialization power line, and a sixth electrode connected to the second electrode; and a light emitting element electrically connected to the second electrode.

In an exemplary embodiment, a first capacitor may be defined between the first gate electrode and the initialization power line, a portion of the initialization power line may define a first capacitor electrode of the first capacitor, and a portion of the first gate electrode may define a second capacitor electrode of the first capacitor.

In an exemplary embodiment, a second capacitor may be defined between the fourth electrode and the data line.

In an exemplary embodiment, a capacitance of the second capacitor may be larger than a capacitance of the first capacitor.

In an exemplary embodiment, the fourth electrode may be electrically connected to a first conductive pattern disposed on the fourth electrode through a contact hole, a portion of the data line may define a third capacitor electrode of the second capacitor, and a portion of the first conductive pattern may define a fourth capacitor electrode of the second capacitor.

In an exemplary embodiment, the first conductive pattern may be disposed on a layer between the fourth electrode and the data line.

In an exemplary embodiment, the first conductive pattern may be electrically connected to a second conductive pattern disposed on the data line through another contact hole, another portion of the data line may define the third capacitor electrode of the second capacitor, and a portion of the second conductive pattern may define the fourth capacitor electrode of the second capacitor.

In an exemplary embodiment, the second conductive pattern may be disposed on the data line.

In an exemplary embodiment, the display device may further include an upper initialization power line insulated from the scan line, extending along the second direction, and connected to the initialization power line, where the upper initialization power line and the driving voltage line may be disposed on a same layer, and may include a same material as each other.

In an exemplary embodiment, the upper initialization power line and the initialization power line may be electrically connected to each other through a first bridge pattern and contact holes disposed between the upper initialization power line and the initialization power line.

In an exemplary embodiment, the first gate electrode of the first switching element may be electrically connected to the third electrode of the second switching element through a second bridge pattern.

According to another exemplary embodiment of the invention, a display device includes: a substrate; a semiconductor layer disposed on the substrate and including a first portion, a second portion and a third portion connecting the first portion and the second portion; a first insulating layer disposed on the semiconductor layer; a first conductive layer disposed on the first insulating layer and including a first gate electrode overlapping the first portion, a second gate electrode overlapping the second portion and a third gate electrode overlapping the third portion; a second insulating layer disposed on the first conductive layer; and a second conductive layer disposed on the second insulating layer and including an initialization power line extending along a first direction and overlapping the first gate electrode and a scan line extending along the first direction and connected to the second gate electrode, where the initialization power line and the third gate electrode are connected to each other.

In an exemplary embodiment, the display device may further comprise: a third insulating layer disposed on the second conductive layer; a third conductive layer disposed on the third insulating layer and including a first conductive pattern connected between the second portion and the third portion; a fourth insulating layer disposed on the third conductive layer; and a fourth conductive layer disposed on the fourth insulating layer and including a data line extending along a second direction perpendicular to the first direction and overlapping the first conductive pattern.

In an exemplary embodiment, the display device may further include: a fifth insulating layer disposed on the fourth conductive layer; and a fifth conductive layer disposed on the fifth insulating layer, extending along the second direction and including a driving voltage line connected to one side of the first portion.

In an exemplary embodiment, the fifth insulating layer may further include an upper initialization power line extending along the second direction, spaced apart from the driving voltage line and connected to the initialization power line and the third gate electrode.

In an exemplary embodiment, the third conductive layer may further include a bridge pattern, where the bridge pattern may be in direct contact with and connected to the third gate electrode and the initialization power line through a contact hole, and the upper initialization power line may be in direct contact with and connected to the bridge pattern through another contact hole.

In an exemplary embodiment, the display device may further comprise: a sixth insulating layer disposed on the fifth conductive layer; and a light emitting element disposed on the sixth insulating layer and connected to the other side of the first portion.

According to yet another exemplary embodiment of the invention, a display device includes: a first switching element including a first gate electrode connected to a first node, a first electrode connected to a driving voltage line to which a driving voltage is provided, and a second electrode connected to a third node; a second switching element including a second gate electrode connected to a scan line, a third electrode connected to the first node and a fourth electrode connected to a second node; a third switching element including a third gate electrode connected to an initialization power line to which initialization power is provided, a fifth electrode connected to the second node and a sixth electrode connected to the third node; a light emitting element connected to the third node; a first capacitor connected between the first node and the initialization power line; and a second capacitor connected between the second node and a data line.

In an exemplary embodiment, a capacitance of the second capacitor may be larger than a capacitance of the first capacitor.

In an exemplary embodiment, the first to third switching elements may be p-type transistors.

According to embodiments of the disclosure, a display device may have high resolution.

Further, according to embodiments of the disclosure, a display device may have improved display quality by minimizing the visibility of crosstalk in a high-resolution structure.

BRIEF DESCRIPTION OF THE DRAWINGS

The above and other features of the disclosure will become more apparent by describing in detail exemplary embodiments thereof with reference to the attached drawings, in which:

FIG. 11 is a cross-sectional view taken along line X6-X6' of FIG. 4.

DETAILED DESCRIPTION

Figure 1:
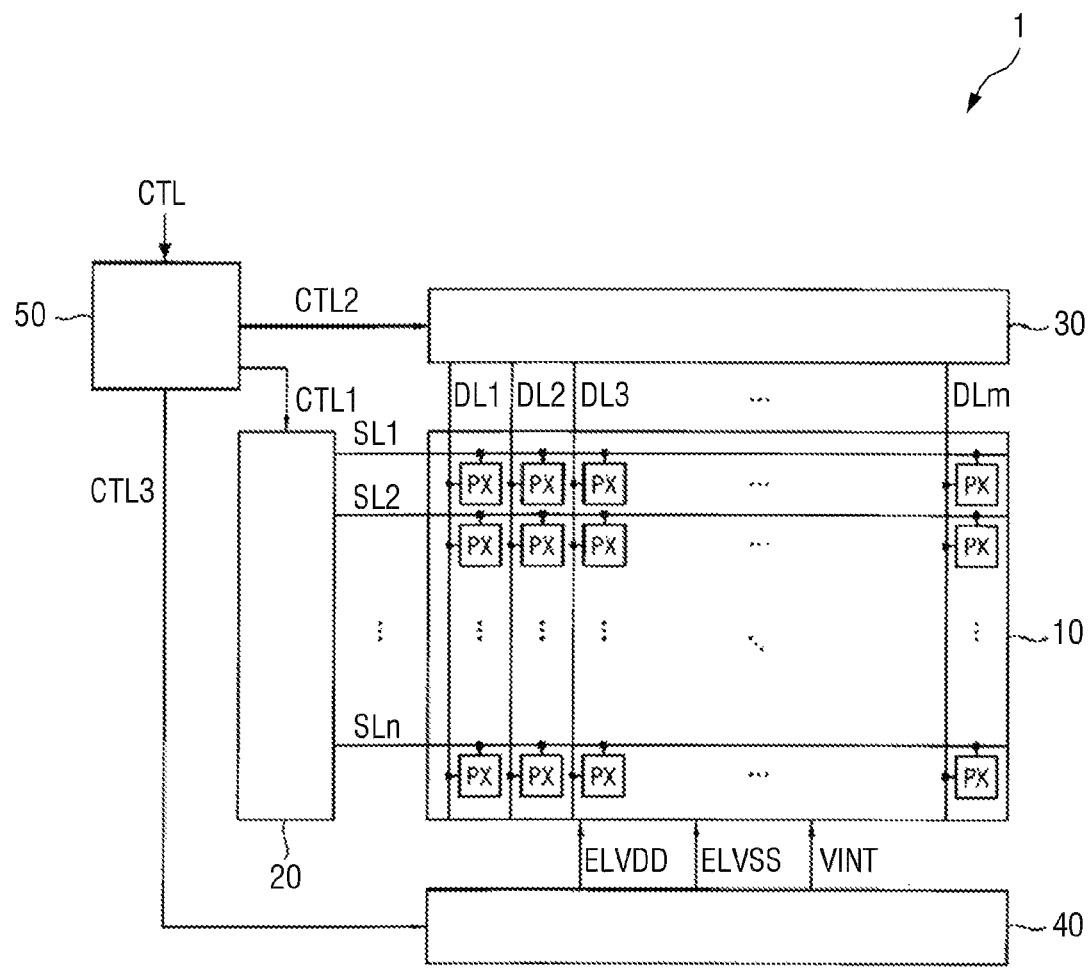
FIG. 1 is a schematic block diagram of an embodiment of a display device.

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other. Like numbers refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof "At least one" is not to be construed as limiting "a" or "an." "Or" means "and/or." As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the disclosure will be described in detail with reference to the accompanying drawings.

FIG. 1 is a schematic block diagram of an embodiment of a display device.

Referring to FIG. 1, an embodiment of a display device 1 may include a display panel 10 including a plurality of pixels PX, and a panel driver for driving the display panel 10.

In an embodiment, the panel driver may drive the display panel 10 in a simultaneous light emission mode including a non-light emission period, in which the pixels PX do not emit light, and a light emission period, in which the pixels PX emit light simultaneously with each other. In an embodiment, the panel driver may include a scan driver 20, a data driver 30, a power supply unit 40 and a timing controller 50.

The display panel 10 may include a plurality of pixels PX to display an image. In one embodiment, for example, the display panel 10 may include n×m pixels PX connected to the intersections of first to n-th (where n is an integer greater than 1) scan lines SL1 to SLn and first to m-th (where m is an integer greater than 1) data lines DL1 to DLm. The pixels PX may be connected to an initialization power source VINT and a first power source ELVDD having a voltage level varying within one frame period and driven in a simultaneous light emission mode. The structure and driving method of the pixels PX will be described later in greater detail.

In an embodiment, the scan driver 20 may provide a scan signal to the pixels PX through the first to the n-th scan lines SL1 to SLn based on a first control signal CTL1.

The data driver 30 may convert digital image data into an analog data signal based on a second control signal CTL2, and provide the data signal to the pixels PX through the first through m-th data lines DL1 through DLm.

The power supply unit 40 may supply an initialization power VINT, a common voltage ELVSS and a driving voltage ELVDD having a voltage level varying within one frame period to the pixels PX based on a third control signal CTL3. In one embodiment, for example, the power supply unit 40 may include a direct-current-to-direct current ("DC-DC") converter which generates output voltages having different voltage levels based on an input voltage (e.g., a battery voltage), and switches for selecting the output voltages as the driving voltage ELVDD, the common voltage ELVSS and the initialization power VINT based on the third control signal CTL3 to set the respective voltage levels for the driving voltage ELVDD, the common voltage ELVSS and the initialization power VINT.

The timing controller 50 may control the scan driver 20, the data driver 30 and the power supply unit 40. In one embodiment, for example, the timing controller 50 may receive a control signal CTL from an external circuit such as a system board. The timing controller 50 may generate the first to third control signals CTL1 to CTL3 to control the scan driver 20, the data driver 30 and the power supply unit 40, respectively. The first control signal CTL1 for controlling the scan driver 20 may include a scan start signal, a scan clock signal and the like. The second control signal CTL2 for controlling the data driver 30 may include a horizontal start signal, a load signal, image data and the like. The third control signal CTL3 for controlling the power supply unit 40 may include a switch control signal for controlling the voltage levels of the driving voltage ELVDD, the common voltage ELVSS and the initialization power VINT. The timing controller 50 may generate digital image data corresponding to the operation conditions of the display panel 10 based on the input image data, and provide the digital image data to the data driver 30.

The display device 1 may improve the display quality by compensating the threshold voltage of the driving transistor and including pixels driven in the simultaneous light emission mode. In one embodiment, for example, a head mounted display ("HMD") may be mounted on a head of a user and may enlarge an image (i.e., an image outputted from the display panel) using a lens, and provide an image directly to the user's eyes. Thus, when the display panel is driven in a sequential light emission mode, screen dragging, color bleeding and the like may be viewed by the user. Since the display device 1 drives pixels having a relatively simple structure in a simultaneous light emission mode, a high-resolution display device with high display quality may be realized.

Figure 2:
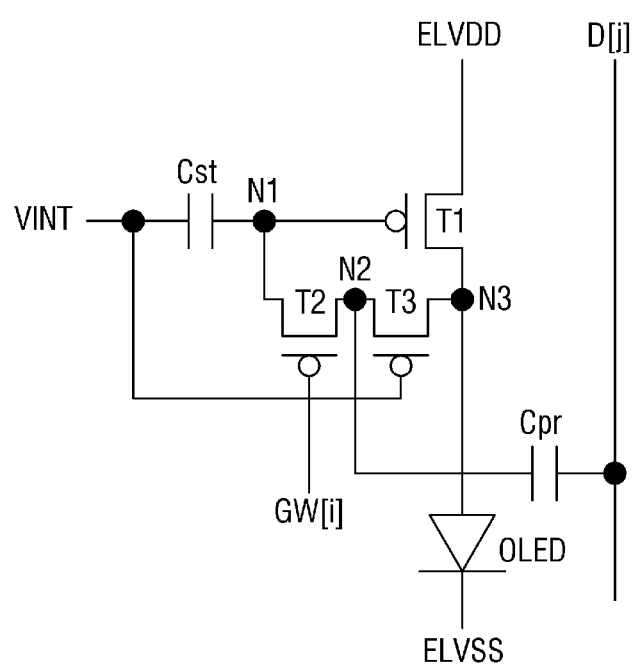
FIG. 2 is an equivalent circuit diagram of an embodiment of a pixel shown in FIG. 1.

FIG. 2 is an equivalent circuit diagram of an embodiment of a pixel shown in FIG. 1.

Referring to FIG. 2, the pixel PX includes a light emitting device OLED, a first switching element T1, a second switching element T2, a third switching element T3, a first capacitor Cst and a second capacitor Cpr. The pixel PX may be located in an i-th pixel row and a j-th pixel column.

The first switching element T1, the second switching element T2 and the third switching element T3 may be thin film transistors. In some embodiments, each of the first switching element T1, the second switching element T2 and the third switching element T3 may be n-type metal-oxide-semiconductor ("NMOS") transistors, but the disclosure is not limited thereto. Alternatively, the first, second and third switching elements T1, T2 and T3 may be p-type metaloxide-semiconductor ("PMOS") transistors. Some of the first switching element T1, the second switching element T2 and the third switching element T3 may be PMOS transistors, and others may be NMOS transistors. Hereinafter, for convenience of description, an embodiment where each of the first switching element T1, the second switching element T2 and the third switching element T3 is an NMOS transistor will be described in detail.

The first switching element T1 may include a gate electrode connected to a first node N1, a first electrode connected to a driving voltage line, to which the driving voltage ELVDD is provided, and a second electrode connected to a third node N3. The second switching element T2 may include a gate electrode that receives an i-th scan signal GW[i] from, a third electrode connected to the first node N1 and a fourth electrode connected to the second node N2. The third switching element T3 may include a gate electrode connected to the initialization power line to which the initialization power VINT is provided, a fifth electrode connected to the second node N2 and a sixth electrode connected to the third node N3.

The first switching element T1 may be a driving transistor. In an embodiment, the first switching element T1 may include a first gate electrode connected to the first node N1, a first electrode connected to a driving voltage line to which the driving voltage ELVDD is provided and a second electrode connected to the third node N3.

The second switching element T2 may connect the first node N1 and the second node N2 in response to the i-th scan signal GW[i]. In an embodiment, the second switching element T2 may include a second gate electrode that receives the i-th scan signal GW[i] from the scan line, a third electrode connected to the first node N1 and a fourth electrode connected to the second node N2.

The third switching element T3 may connect the second node N2 and the third node N3 in response to the voltage level of the initialization power VINT. In an embodiment, the third switching element T3 may include a third gate electrode that receives the initialization power VINT from the initialization power line, a fifth electrode connected to the second node N2 and a sixth electrode connected to the third node N3.

The first capacitor Cst may be located between the initialization power VINT and the first node N1. In an embodiment, the first capacitor Cst may include a first capacitive electrode connected to the initialization power line to which the initialization power VINT is provided and a second capacitive electrode connected to the first node N1. In some embodiments, the first capacitor Cst may be a sustain capacitor.

The second capacitor Cpr may be connected between the data line and the third node N3. In an embodiment, the second capacitor Cpr may include a third capacitive electrode that receives a data signal D[j] from the data line and a fourth capacitive electrode connected to the third node N3. In some embodiments, the second capacitor Cpr may be a luminance compensation capacitor, and the capacitance of the second capacitor Cpr may be greater than the capacitance of the first capacitor Cst.

The light emitting device OLED may emit light based on the driving current flowing from the first switching element T1. In an embodiment, the light emitting device OLED may include a first device electrode connected to the third node N3 and a second device electrode connected to a common power source to which the common voltage ELVSS is provided.

In an embodiment of the pixel PX shown in FIG. 2, the third switching element T3 is connected between the fourth electrode of the second switching element T2 and the first device electrode of the organic light emitting device OLED. Thus, since the second node N2 and the third node N3 may be separated by the third switching element T3, while the data signal D[j] is written to the first gate electrode (i.e., the first node N1) of the first switching element T1, even when a leakage current flows from the driving voltage line, to which the driving voltage ELVDD is provided, to the third node N3 through the first switching element T1, the data signal D[j] written to the gate electrode of the first switching element T1 is not affected, and thus the display quality may be improved.

In such an embodiment, since the third switching element T3 for blocking the leakage current is controlled by the initialization power VINT, the leakage current may be effectively blocked without using a separate control signal applying wiring for controlling the third switching element T3.

In such an embodiment, since the second capacitor Cpr is connected between the data line and the third node N3, a reduction in luminance of the light emitting device due to the parasitic capacitor between the first node N1 or the first switching element T1 connected to the first node N1 and the other components may be effectively compensated. Thus, the display quality may be further improved.

Figure 3:
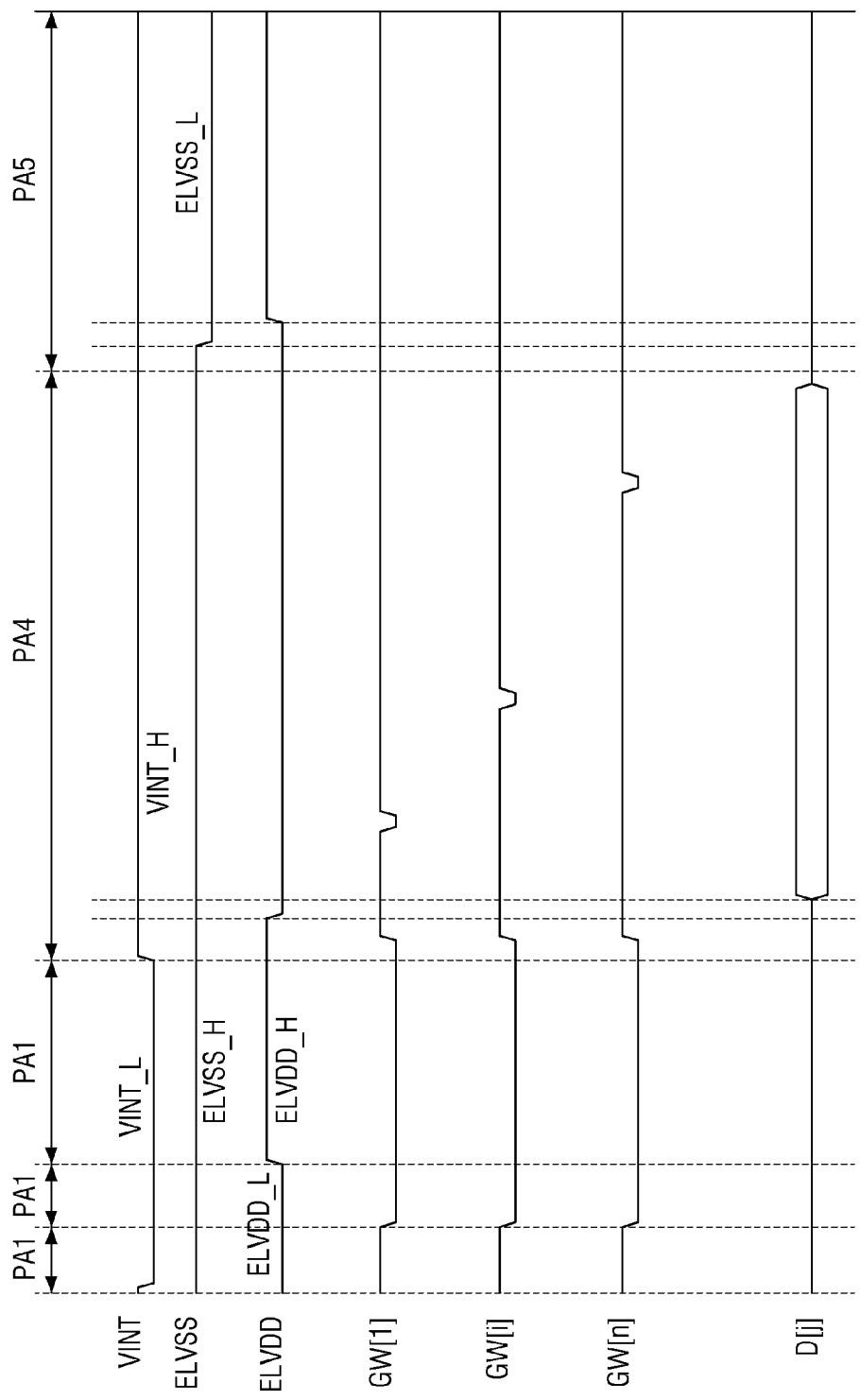
FIG. 3 is a diagram illustrating signals for driving the pixel of FIG. 2.

FIG. 3 is a diagram showing signals for driving the pixel of FIG. 2. More specifically, FIG. 3 shows signals for driving pixels in a simultaneous light emission mode.

Referring to FIGS. 1 to 3, the panel driver may drive the display panel 10 in a simultaneous light emission mode including non-light emission periods PA1 to PA4, in which pixels do not emit light, and a light emission period PA5, in which the pixels emit light simultaneously. The non-light emission period may sequentially include a first initialization period PA1, in which the voltages of the second node N2 and the first device electrode of the light emitting device OLED are initialized, a second initialization period PA2, in which the first gate electrode (i.e., the first node N1) of the first switching element T1 is initialized, a threshold voltage compensation period PA3, in which the first switching element T1 is connected to the light emitting device OLED, and a data write period PA4, in which the data signal D[j] is written to the pixels.

In an exemplary embodiment, the pixels may be connected to the driving voltage line to which the driving voltage ELVDD having a voltage level varying within one frame period is provided, and connected to the initialization power line to which the initialization power VINT is provided. In one embodiment, for example, the driving voltage ELVDD may have any one of a first voltage level ELVDD_L and a second voltage level ELVDD_H which is greater than the first voltage level ELVDD_L. The initialization power VINT may have any one of a third voltage level VINT_L and a fourth voltage level VINT_H which is greater than the third voltage level VINT_L. The common voltage ELVSS may have any one of a fifth voltage level ELVSS_L and a sixth voltage level ELVSS_H which is greater than the fifth voltage level ELVSS_L.

In an embodiment, the first voltage level ELVDD_L and the fifth voltage level ELVSS_L may be the same voltage level as each other, and the second voltage level ELVDD_H and the sixth voltage level ELVSS_H may be the same voltage level as each other. In an embodiment, the third voltage level VINT_L may be a voltage level lower than the first voltage level ELVDD_L and the fifth voltage level ELVSS_L, and the fourth voltage level VINT_H may be a voltage level higher than the first voltage level ELVDD_L and the fifth voltage level ELVSS_L and lower than the second voltage level ELVDD_H and the sixth voltage level ELVSS_H.

In an exemplary embodiment, a reference voltage may be applied to the data line in periods other than the data write period PA4, and a data signal for expressing the gray level may be provided to the data line in the data write period PA4.

In an exemplary embodiment, as shown in FIG. 3, in the first initialization period PA1, the driving voltage ELVDD may have the first voltage level ELVDD_L, and the initialization power VINT may have the third voltage level VINT_L. In the first initialization period PA1, The common voltage ELVSS may have the sixth voltage level ELVSS_H, and the scan signal GW[i] may have an off level. Accordingly, a current flows from the third node N3 to the driving voltage line to which the driving voltage ELVDD is provided through the first switching element T1, and the voltage of the third node N3 may be set to the first voltage level ELVDD_L, and the voltage of the second node N2 may also be set to the first voltage level ELVDD_L. That is, the voltage of the first device electrode of the light emitting device OLED may be initialized in the first initialization period PA1.

In the second initialization period PA2, the driving voltage ELVDD may have the first voltage level ELVDD_L, the initialization power VINT may have the third voltage level VINT_L, the common voltage ELVSS may have the sixth voltage level ELVSS_H, and the scan signal GW[i] may have an ON level. Accordingly, the first gate electrode of the first switching element T1 and the second electrode of the first switching element T1 may be connected by the second switching element T2 and the third switching element T3 which have turned on. Therefore, the voltage of the first node N1 and the voltage of the third node N3 may correspond a voltage (i.e., ELVDD_L+Vth) obtained by adding the threshold voltage Vth of the first switching element T1 to the first voltage level ELVDD_L. That is, the voltage of the first device electrode of the light emitting device OELD and the voltage of the first gate electrode of the first switching element T1 may be initialized in the second initialization period PA2.

In the threshold voltage compensation period PA3, the driving voltage ELVDD may have the second voltage level ELVDD_H, the initialization power VINT may have the third voltage level VINT_L, and the scan signal GW[i] may have an on level. Thus, the component of the threshold voltage Vth of the first switching element T1 may be removed at the voltage level of the first node N1.

In the data write period PA4, the driving voltage ELVDD may have the first voltage level ELVDD_L, the initialization power VINT may have the fourth voltage level VINT_H, and the common voltage ELVSS may have the sixth voltage level ELVSS_H. Accordingly, the panel driver may sequentially provide the scan signals GW[1] to GW[n] having the ON level to the scan lines such that the data signal D[j] is written to the pixels PX.

In the light emission period PA5, the driving voltage ELVDD may have the second voltage level ELVDD_H, the initialization power VINT may have the fourth voltage level VINT_H, the common voltage ELVSS may have the third voltage Level ELVSS_L, and the scan signal GW[i] may have an OFF level. That is, as the initialization power VINT has the fourth voltage level VINT_H in the light emission period PA5, the third switching element T3 maintains an off state in the light emission period PA5, and the connection between the second node N2 and the third node N3 is blocked in the light emission period PA5. The driving voltage ELVDD is changed to have a higher voltage level than the common voltage ELVSS, so that the driving current may be generated. Since the driving current flows to the light emitting device OELD through the first switching element T1, the pixels PX may emit light simultaneously.

Although FIG. 3 illustrates an exemplary embodiment in which the pixels PX are driven using the driving voltage ELVDD, the initialization power VINT and the common voltage ELVSS having a voltage level varying within one frame period, embodiments are not limited thereto. In an alternative embodiment, the pixels PX may be driven in various ways.

In one embodiment, for example, when the voltage level of the driving voltage ELVDD is set higher than the first voltage level ELVDD_L but lower than the second voltage level ELVDD_H in the threshold voltage compensation period PA3, the voltage applied to the first node N1 may be effectively prevented from spiking up due to the kickback of the third switching element T3.

Figure 4:
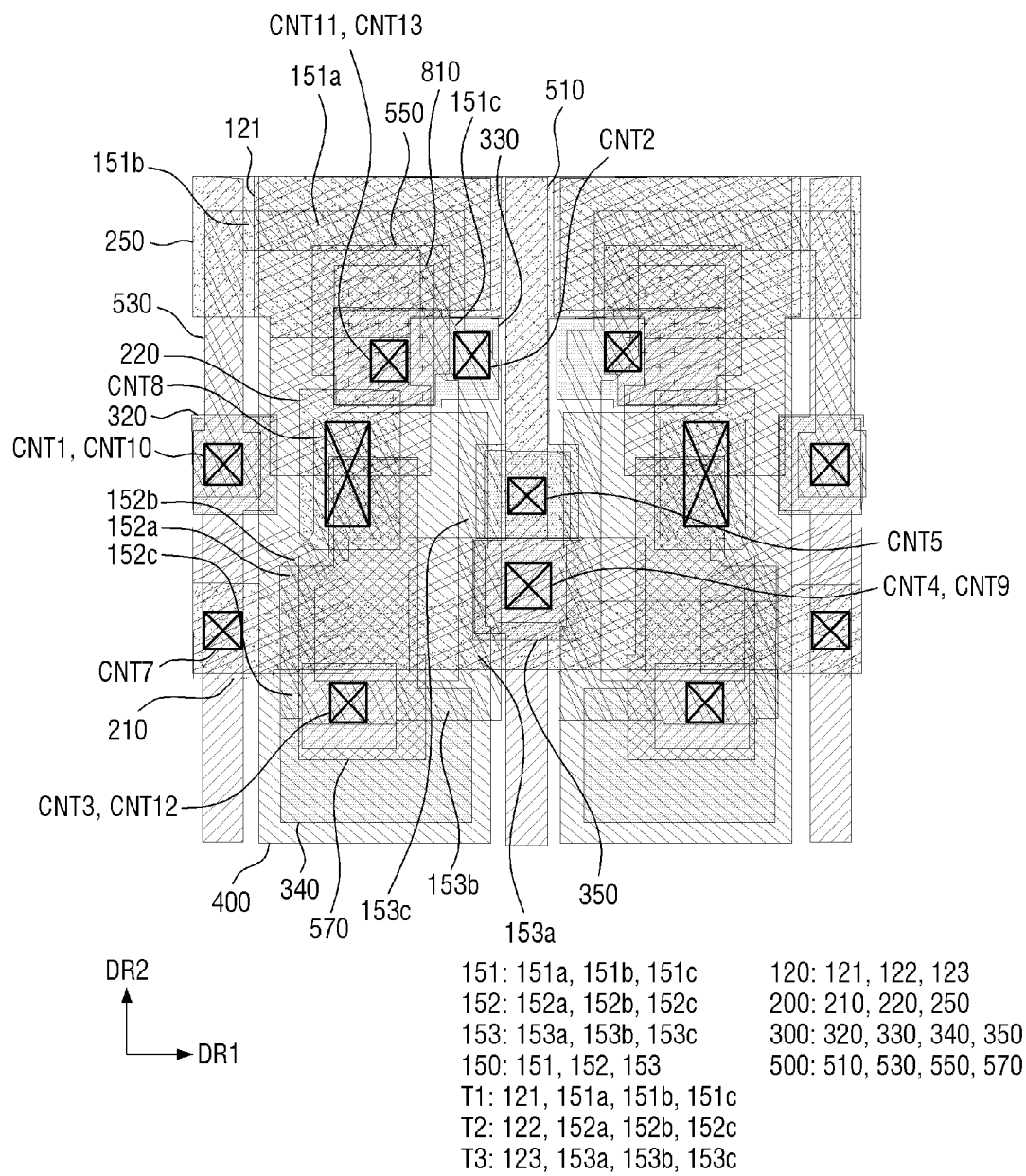
FIG. 4 is a plan view of an embodiment of a pixel shown in FIG. 1.
Figure 5:
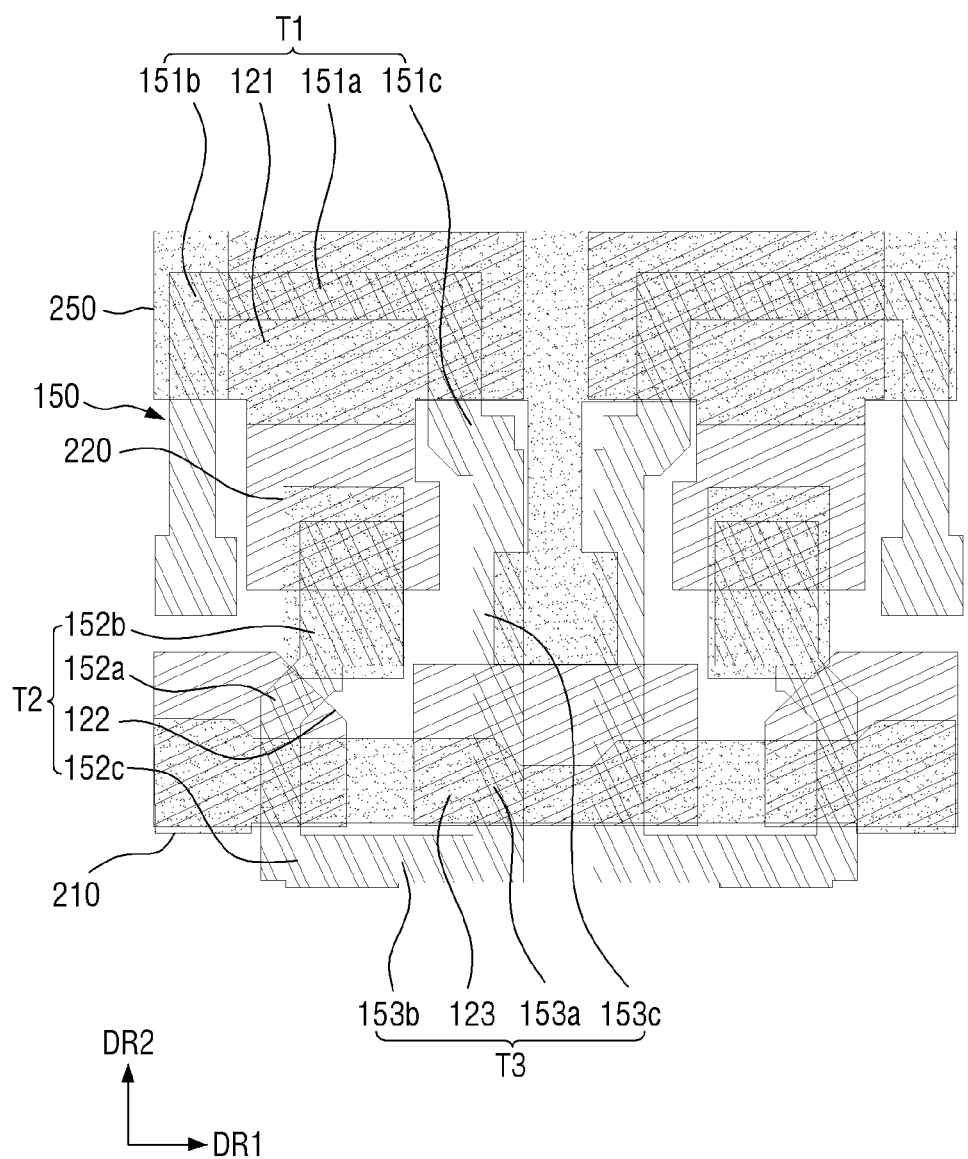
FIG. 5 is a plan view of a semiconductor layer, a first conductive layer and a second conductive layer of FIG. 4.
Figure 6:
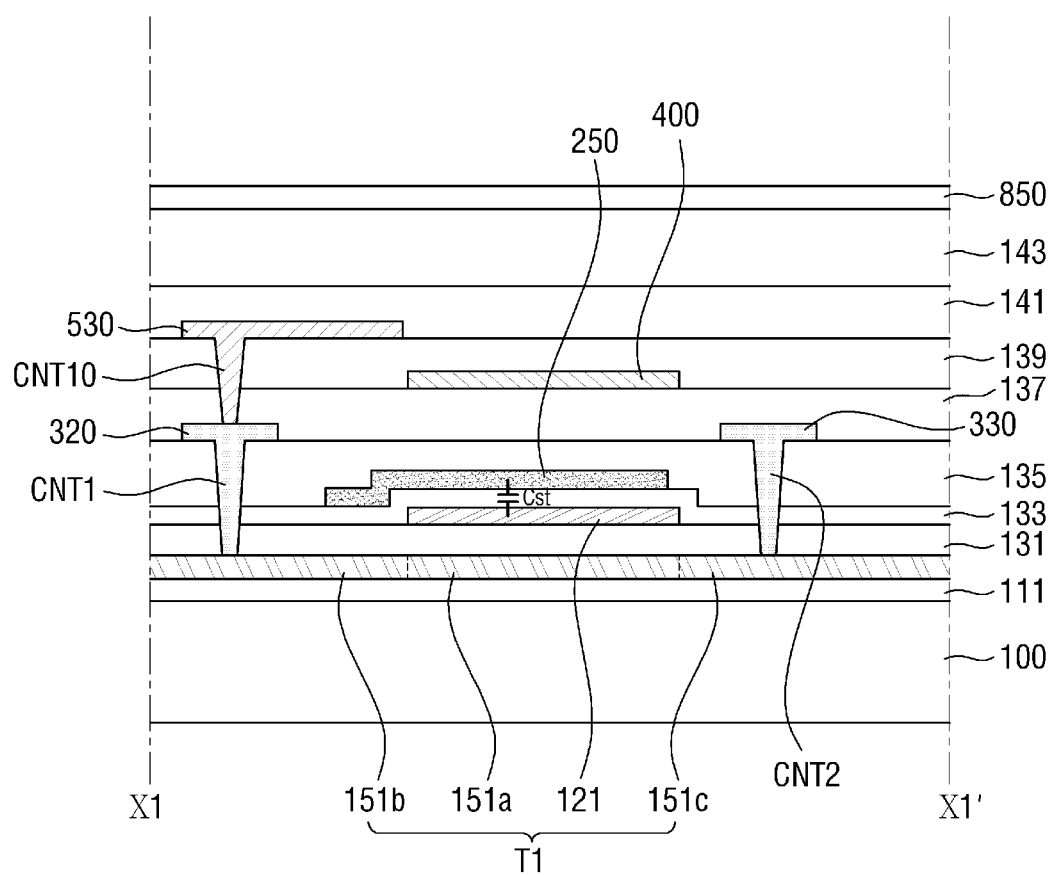
FIG. 6 is a cross-sectional view taken along line X1-X1' of FIG. 4.
Figure 7:
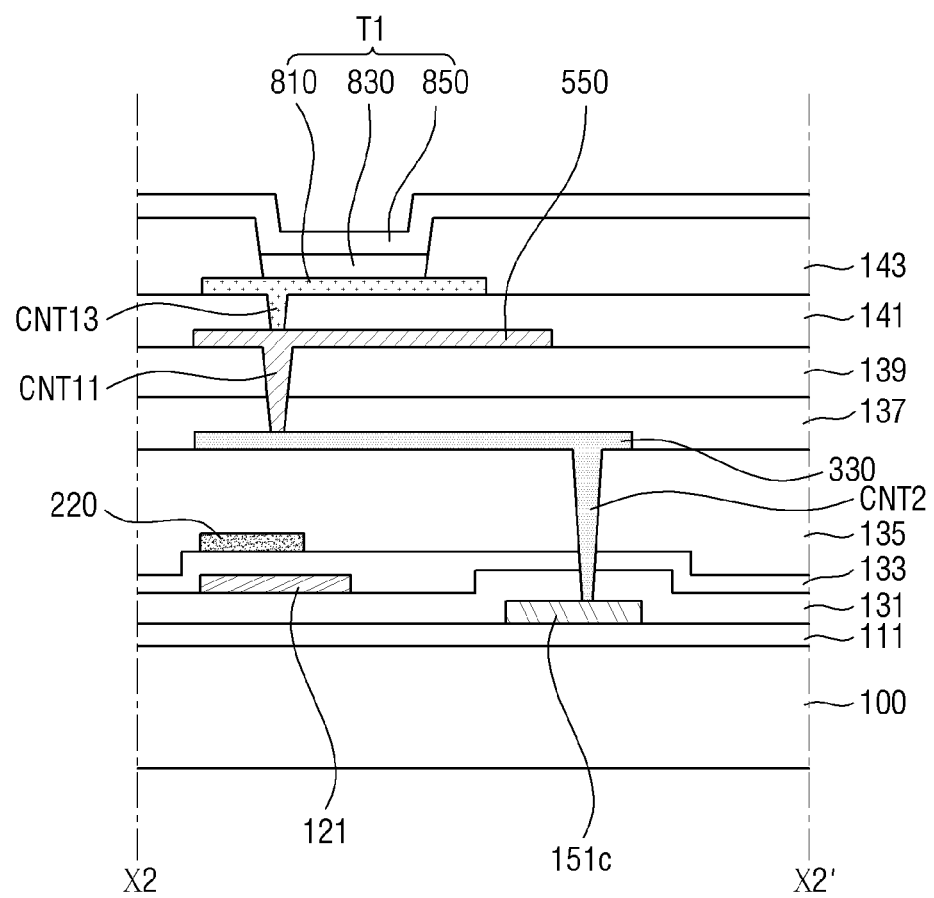
FIG. 7 is a cross-sectional view taken along line X2-X2' of FIG. 4.
Figure 8:
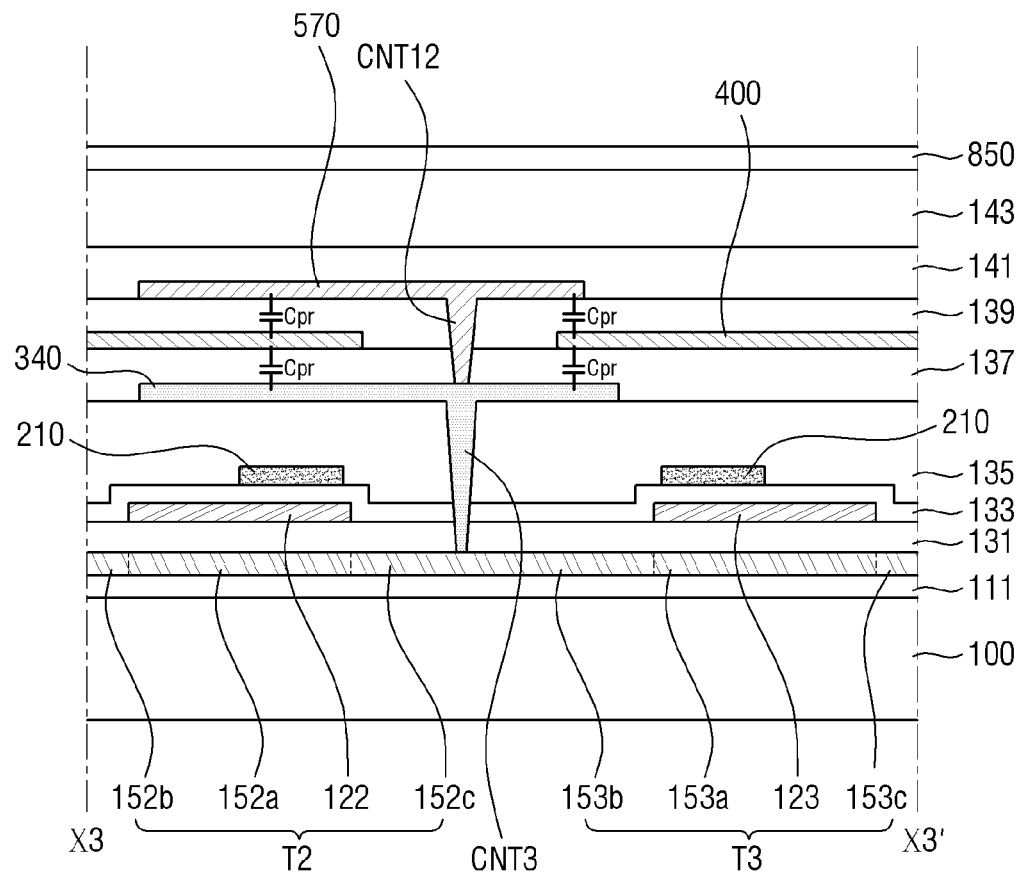
FIG. 8 is a cross-sectional view taken along line X3-X3' of FIG. 4.
Figure 9:
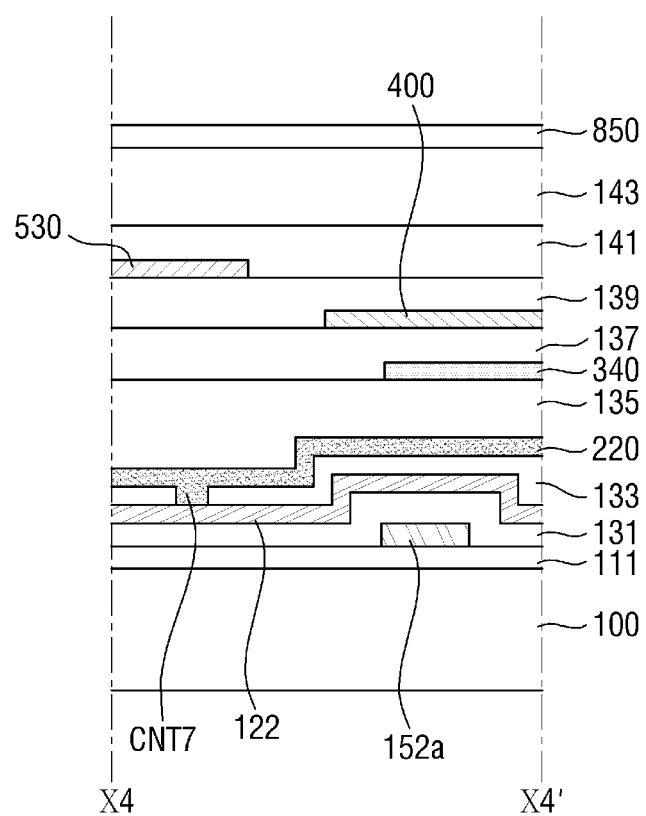
FIG. 9 is a cross-sectional view taken along line X4-X4' of FIG. 4.
Figure 10:
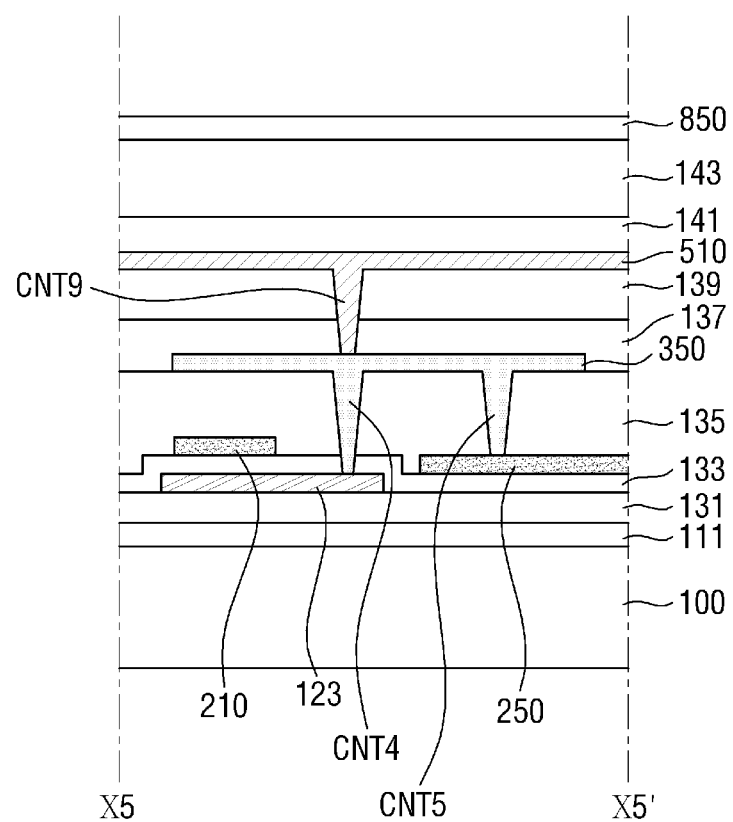
FIG. 10 is a cross-sectional view taken along line X5-X5' of FIG. 4.

FIG. 4 is a plan view of an embodiment of a pixel shown in FIG. 1. FIG. 5 is a plan view of a semiconductor layer, a first conductive layer and a second conductive layer of FIG. 4. FIG. 6 is a cross-sectional view taken along line X1-X1' of FIG. 4. FIG. 7 is a cross-sectional view taken along line X2-X2' of FIG. 4. FIG. 8 is a cross-sectional view taken along line X3-X3' of FIG. 4. FIG. 9 is a cross-sectional view taken along line X4-X4' of FIG. 4. FIG. 10 is a cross-sectional view taken along line X5-X5' of FIG. 4. FIG. 11 is a cross-sectional view taken along line X6-X6' of FIG. 4. In the following embodiments, new reference numerals are given to some of the elements although they are substantially the same as the elements mentioned in FIGS. 1 and 2 to facilitate the description of the arrangement and association between the elements.

Referring to FIGS. 4 to 11, as described above, an exemplary embodiment of the pixel includes a first switching element T1, a second switching element T2, a third switching element T3, a first capacitor Cst, a second capacitor Cpr and a light emitting device OLED.

Hereinafter, the stacked structure of each pixel PX of the display device will be described in detail.

In an exemplary embodiment, as shown in FIGS. 6 to 11 the stacked structure of each pixel PX includes a substrate 100. In an exemplary embodiment, the substrate 100 may include or be made of an insulating material such as glass, quartz and polymer resin. In such an embodiment, the polymer resin include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. In an alternative exemplary embodiment, the substrate 100 may include a metal material.

The substrate 100 may be a rigid substrate or a flexible substrate, e.g., a bendable substrate, a foldable substrate, a rollable substrate and the like. In one embodiment, for example, the flexible substrate may include or be formed of PI, but is not limited thereto.

In such an embodiment, a buffer layer 111 may be disposed on the substrate 100. The buffer layer 111 may be disposed over the entire surface of the substrate 100. The buffer layer 111 may effectively prevent diffusion of impurity ions, effectively prevent penetration of moisture or outside air, and perform a surface planarization function.

The buffer layer 111 may include silicon nitride, silicon oxide, silicon oxynitride, or the like. In an alternative exemplary embodiment, the buffer layer 111 may be omitted depending on the type of the substrate 100, process conditions, and the like.

In such an embodiment, a semiconductor layer 150 may be disposed on the buffer layer 111.

In an exemplary embodiment, as shown in FIG. 4, the semiconductor layer 150 includes a first portion 151, a second portion 152 and a third portion 153. The first portion 151 includes a channel portion 151a, a first electrode 151b and a second electrode 151c of the first switching element T1, and the second portion 152 includes a channel portion 152a, a third electrode 152b and a fourth electrode 152c of the second switching element T2. The third portion 153 includes a channel portion 153a, a fifth electrode 153b and a sixth electrode 153c of the third switching element T3.

The first portion 151, the second portion 152 and the third portion 153 may be disposed on a same layer and may include (e.g., be formed of) a same material as each other. As used hereafter, the term "being disposed on a same layer" includes the meaning "being disposed at a same level or directly on a same layer." The term "being disposed on a same layer" includes the meaning that the layers immediately below the corresponding components are identical to each other or being formed simultaneously in a same process.

The first electrode 151b may be connected to one end of the channel portion 151a, and the second electrode 151c may be connected to the other end of the channel portion 151a. In such an embodiment, one side of the first portion 151 may define the first electrode 151b and the other side of the first portion 151 may define the second electrode 151c. In an exemplary embodiment, the third electrode 152b may be connected to one end of the channel portion 152a, and the fourth electrode 152c may be connected to the other end of the channel portion 152a. In such an embodiment, one side of the second portion 152 may defined the third electrode 152b, and the other side of the second portion 152 may defined the fourth electrode 152c. The fifth electrode 153b may be connected to one end of the channel portion 153a and the sixth electrode 153c may be connected to the other end of the channel portion 153a. In such an embodiment, one side of the third portion 153 may define the fifth electrode 153b, and the other side of the third portion 153 may define the sixth electrode 153c.

Herein, the term "connected" means that the two components are physically connected to each other. The term "electrically connected" is a concept including not only a case where two components are physically connected but a case where two components are electrically connected through another conductor without being physically connected.

The third portion 153 may extend from the first portion 151 and may be formed integrally with the first portion 151 as a single unitary and indivisible unit. In such an embodiment, the sixth electrode 153c of the third portion 153 may extend from the second electrode 151c of the first portion 151 and may be connected to the second electrode 151c.

The second portion 152 may extend from one end of the third portion 153 and may be formed integrally with the third portion 153 as a single unitary and indivisible unit. In such an embodiment, the third electrode 152b of the second portion 152 may extend from the fifth electrode 153b of the third portion 153 and may be connected to the fifth electrode 153b.

In an exemplary embodiment, the semiconductor layer 150 may include polycrystalline silicon. In an exemplary embodiment, the polycrystalline silicon may be formed by crystallizing amorphous silicon. In such an embodiment, the crystallization method may include rapid thermal annealing ("RTA"), solid phase crystallization ("SPC"), excimer laser annealing ("ELA"), metal induced crystallization ("MIC"), metal induced lateral crystallization ("MILC"), sequential lateral solidification ("SLS") and the like, but the disclosure is not limited thereto. In an alternative exemplary embodiment, the semiconductor layer 150 may include monocrystalline silicon, low-temperature polycrystalline silicon, amorphous silicon and the like. However, the disclosure is not limited thereto, and in another alternative exemplary embodiment, the semiconductor layer 150 may include an oxide semiconductor. In one embodiment, for example, the semiconductor layer 150 may be a binary compound (ABx), a ternary compound (ABxCy), and a tetravalent compound (ABxCyDz) including indium, zinc, gallium, tin, titanium, aluminum, hafnium (Hf), zirconium (Zr), magnesium (Mg) and the like. In one exemplary embodiment, for example, the semiconductor layer 150 may include indium-tin-zinc-oxide ("ITZO") or indium-gallium-zinc-oxide ("IGZO").

The first electrode 151b, the second electrode 151c, the third electrode 152b, the fourth electrode 152c, the fifth electrode 153b and the sixth electrode 153c in the semiconductor layer 150 may be doped with impurity ions, e.g., n-type impurity ions in an embodiment, where the switching elements are NMOS transistors.

In such an embodiment, an first insulating layer 131 may be disposed on the semiconductor layer 150. The first insulating layer 131 may be disposed generally over the entire surface of the substrate 100. The first insulating layer 131 may be a gate insulating film having a gate insulating characteristics.

In an exemplary embodiment, the first insulating layer 131 may include a silicon compound, a metal oxide or the like. In one exemplary embodiment, for example, the first insulating layer 131 may include at least one of silicon oxide, silicon nitride, silicon oxynitride, aluminum oxide, tantalum oxide, hafnium oxide, zirconium oxide, titanium oxide, and a combination thereof. The first insulating layer 131 may be a single film or a multilayer film made of a laminated film of different materials.

In such an embodiment, a first conductive layer 120 may be disposed on the first insulating layer 131.

The first conductive layer 120 may include the first gate electrode 121 of the first switching element T1, the second gate electrode 122 of the second switching element T2, and the third gate electrode 123 of the third switching element T3.

The first gate electrode 121, the second gate electrode 122 and the third gate electrode 123 may be disposed on a same layer and may include a same material.

The first gate electrode 121, the second gate electrode 122 and the third gate electrode 123 may be spaced apart from each other. In such an embodiment, the first gate electrode 121 may overlap the channel portion 151a of the first portion 151 of the semiconductor layer 150 and may not overlap the first electrode 151b and the second electrode 151c, and the second gate electrode 122 may overlap the channel portion 152a of the second portion 152 of the semiconductor layer 150 and may not overlap the third electrode 152b and the fourth electrode 152c. In such an embodiment, the third gate electrode 123 may overlap the channel portion 153a of the third portion 153 of the semiconductor layer 150 and may not overlap the fifth electrode 153b and the sixth electrode 153c.

The first conductive layer 120 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W) and copper (Cu). The first conductive layer 120 may be a single film or a multilayer film.

In an exemplary embodiment, a second insulating layer 133 may be disposed on the first conductive layer 120. The second insulating layer 133 may insulate the first conductive layer 120 from a second conductive layer 200. The second insulating layer 133 may be generally disposed over the entire surface of the substrate 100. The second insulating layer 133 may be an interlayer insulating film.

In an exemplary embodiment, the second insulating layer 133 may include an inorganic insulating material such as silicon oxide, silicon nitride, silicon oxynitride, hafnium oxide, aluminum oxide, titanium oxide, tantalum oxide and zinc oxide, or an organic insulating material such as polyacrylates resin, epoxy resin, phenolic resin, polyamides resin, polyimides rein, unsaturated polyesters resin, poly (phenylenethers) resin, polyphenylenesulfides resin and benzocyclobutene ("BCB"). The second insulating layer 133 may be a single film or a multilayer film made of a laminated film made of different materials.

The second conductive layer 200 is disposed on the second insulating layer 133. The second conductive layer 200 may include an initialization power line 250 for transferring an initialization power VINT (see FIG. 2), and a scan line 210 for transferring a scan signal GW[i] (see FIG. 2), and may further include a first bridge pattern 220.

The initialization power line 250, the scan line 210 and the first bridge pattern 220 may be disposed on a same layer and may include a same material as each other.

The initialization power line 250 and the scan line 210 may extend in the row direction or the first direction DR1 and may be spaced apart from one another in the column direction or in the second direction DR2 intersecting the first direction DR1. However, the initialization power line 250 may include a protruding portion along the second direction DR2 to receive the initialization power VINT.

In an exemplary embodiment, as shown in FIG. 6, the initialization power line 250 is disposed to overlap the first gate electrode 121 of the first switching element T1 disposed therebelow across the second insulating layer 133 to form the first capacitor Cst. The first gate electrode 121 of the first switching element T1 defines the first capacitor electrode of the first capacitor Cst and the initialization power line 250, a portion of the initialization power line 250 overlapping with defines the second capacitor electrode of the first capacitor Cst, and the second insulating layer 133 interposed therebetween may be a dielectric of the first capacitor Cst.

In an exemplary embodiment, as shown in FIG. 8, the scan line 210 may be disposed to overlap the second gate electrode 122 of the second switching element T2 disposed therebelow across the second insulating layer 133, and may be in direct contact with and connected to the second gate electrode 122 through a seventh contact hole CNT7 defined through the second insulating layer 133.

In an exemplary embodiment, as shown in FIG. 7, the first bridge pattern 220 may be electrically connected to the third electrode 152b of the second switching element T2 and the first gate electrode 121 of the first switching element T1. In some embodiments, the first bridge pattern 220 may be disposed to overlap the third electrode 152b of the second switching element T2 and the first gate electrode 121 of the first switching element T1. In an exemplary embodiment, as shown in FIG. 11, an eighth contact hole CNT8 may be defined in the first insulating layer 131 and the second insulating layer 133 to partially expose the third electrode 152b and the first gate electrode 121. The first bridge pattern 220 may be in direct contact with and connected to the third electrode 152b and the first gate electrode 121 through the eighth contact hole CNT8. Accordingly, the third electrode 152b and the first gate electrode 121 may be electrically connected to each other through the first bridge pattern 220.

The second conductive layer 200 may include at least one of molybdenum (Mo), aluminum (Al), platinum (Pt), palladium (Pd), silver (Ag), magnesium (Mg), gold (Au), neodymium (Nd), iridium (Ir), chromium (Cr), titanium (Ti), tantalum (Ta), tungsten (W) and copper (Cu).

In an exemplary embodiment, a third insulating layer 135 may be disposed on the second conductive layer 200. The third insulating layer 135 covers the second conductive layer 200. The third insulating layer 135 may be generally disposed over the entire surface of the substrate 100. In some embodiments, the third insulating layer 135 may include a same material as the first insulating layer 131, or may include at least one of the materials list above as a material of the first insulating layer 131.

In an exemplary embodiment, a third conductive layer 300 may be disposed on the third insulating layer 135. The third conductive layer may include a second bridge pattern 320, a third bridge pattern 330, a first conductive pattern 340 and a fourth bridge pattern 350.

The second bridge pattern 320 may receive the driving voltage ELVDD and may provide the driving voltage ELVDD to the first electrode 151b of the first switching element T1. In an exemplary embodiment, as shown in FIG. 6, the second bridge pattern 320 may be disposed to partially overlap the first electrode 151b of the first switching element T1 and may be in direct contact with and connected to the first electrode 151b of the first switching element T1 through a first contact hole CNT1 defined through the first insulating layer 131, the second insulating layer 133 and the third insulating layer 135.

The third bridge pattern 330 may provide a driving current to the light emitting device OLED. In an exemplary embodiment, as shown in FIGS. 6 and 7, the third bridge pattern 330 may be disposed to partially overlap the second electrode 151c of the first switching element T1 and may be in direct contact with and connected to the second electrode 151c of the first switching element T1 through a second contact hole CNT2 defined through the first insulating layer 131, the second insulating layer 133 and the third insulating layer 135.

The first conductive pattern 340 may provide the data signal D[j] (see FIG. 2) to the fourth electrode 152c of the second switching element T2. In an exemplary embodiment, the first conductive pattern 340 may provide the data signal D[j] (see FIG. 2) to the fifth electrode 153b of the third switching element T3. That is, the first conductive pattern 340 may provide the data signal D[j] (see FIG. 2) to the second node N2 (see FIG. 2). In an exemplary embodiment, as shown in FIG. 8, the first conductive pattern 340 may be disposed to partially overlap the fourth electrode 152c of the second switching element T2 and the fifth electrode 153b of the third switching element T3, and may be in direct contact with and connected to the fourth electrode 152c of the second switching element T2 and the fifth electrode 153b of the third switching element T3 through a third contact hole CNT3 defined through the first insulating layer 131, the second insulating layer 133 and the third insulating layer 135.

The fourth bridge pattern 350 may provide the initialization power VINT to the third gate electrode 123 of the third switching element T3. In an exemplary embodiment, as shown in FIG. 10, the fourth bridge pattern 350 may be disposed to partially overlap the third gate electrode 123 of the third switching element T3, and may be in direct contact with and connected to the third gate electrode 123 of the third switching element T3 through a fourth contact hole CNT4 defined through the second insulating layer 133 and the third insulating layer 135.

In such an embodiment, the fourth bridge pattern 350 may provide the initialization power VINT to the initialization power line 250. In such an embodiment, as shown in FIG. 10, the fourth bridge pattern 350 may be disposed to partially overlap the initialization power line 250 and may be in direct contact with and connected to the initialization power line 250 through a fifth contact hole CNT5 defined through the third insulating layer 135.

The third conductive layer 300 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W) and copper (Cu). The third conductive layer 300 may be a single film or a multilayer film. In one embodiment, for example, the third conductive layer 300 may have a stacked structure of Ti/Al/Ti, Mo/Al/Mo, Mo/AlGe/Mo, and Ti/Cu.

In an exemplary embodiment, a fourth insulating layer 137 may be disposed on the third conductive layer 300. The fourth insulating layer 137 covers the third conductive layer 300. The fourth insulating layer 137 may be disposed generally over the entire surface of the substrate 100. In some embodiments, the fourth insulating layer 137 may be an organic insulating layer including an organic material. The organic material may include at least one of imide polymers, general-purpose polymers such as polymethylmethacrylate ("PMMA") and polystyrene ("PS"), polymer derivatives having a phenolic group, acrylic polymers, arylether polymers, amide polymers, fluoropolymers, p-xylene-based polymers, vinyl alcohol-based polymers, and blends thereof.

In an exemplary embodiment, a fourth conductive layer 400 may be disposed on the fourth insulating layer 137. The fourth conductive layer 400 may define a data line 400 that transmits the data signal D[j] (see FIG. 2). Hereinafter, the data line 400 and the fourth conductive layer 400 refer to a same element. The data line 400 may extend along the second direction DR2 which is a column direction. The data line 400 may extend to neighboring pixels beyond the boundary of the pixel PX along the column direction. In some embodiments, the data line 400 may include a wide portion having an expanded or increased line width, or an opening corresponding to a contact hole may be defined therethrough.

In such an embodiment, as shown in FIG. 8, the data line 400 is disposed to overlap the first conductive pattern 340 disposed therebelow across the fourth insulating layer 137 to form a second capacitor Cpr. The first conductive pattern 340 defines the fourth capacitor electrode of the second capacitor Cpr, and a portion of the data line 400 overlapping therewith defines the third capacitor electrode of the second capacitor Cpr, and the fourth insulating layer 137 interposed therebetween may be a dielectric of the second capacitor Cpr.

In an exemplary embodiment, a fifth insulating layer 139 may be disposed on the fourth conductive layer 400. The fifth insulating layer 139 covers the fourth conductive layer 400. The fifth insulating layer 139 may be generally disposed over the entire surface of the substrate 100. In some embodiments, the fifth insulating layer 139 may be an organic insulating layer including an organic material. The organic material may include at least one of imide polymers, general-purpose polymers such as PMMA and PS, polymer derivatives having a phenolic group, acrylic polymers, arylether polymers, amide polymers, fluoropolymers, p-xylene-based polymers, vinyl alcohol-based polymers, and blends thereof.

In an exemplary embodiment, a fifth conductive layer 500 may be disposed on the fifth insulating layer 139. The fifth conductive layer 500 includes an upper initialization power line 510 for transmitting an initialization power VINT (see FIG. 2) to the initialization power line 250, a driving voltage line 530 for transferring a driving voltage ELVDD (see FIG. 2), a sixth bridge pattern 550 and a second conductive pattern 570.

The upper initialization power line 510, the driving voltage line 530, the sixth bridge pattern 550 and the second conductive pattern 570 may be disposed on a same layer and may include a same material as each other.

The upper initialization power line 510 may extend along a second direction DR2 which is a column direction, and may be spaced apart from the driving voltage line 530. The upper initialization power line 510 may extend to neighboring pixels beyond the boundary of the pixel PX along the column direction. The upper initialization power line 510 may be electrically connected to the initialization power line 250 via the fourth bridge pattern 350. In an exemplary embodiment, as shown in FIG. 10, the upper initialization power line 510 may partially overlap the fourth bridge pattern 350, and may be in direct contact with and connected to the fourth bridge pattern 350 through a ninth contact hole CNT9 defined through the fourth insulating layer 137 and the fifth insulating layer 139.

The driving voltage line 530 may extend along a second direction DR2 which is a column direction. The driving voltage line 530 may extend to neighboring pixels beyond the boundary of the pixel PX along the column direction. The driving voltage line 530 may be electrically connected to the first electrode 151b of the first portion 151 via the second bridge pattern 320. In an exemplary embodiment, as shown in FIG. 6, the driving voltage line 530 may partially overlap the second bridge pattern 320, and may be in direct contact with and connected to the second bridge pattern 320 through a tenth contact hole CNT10 defined through the fourth insulating layer 137 and the fifth insulating layer 139.

The sixth bridge pattern 550 may provide a driving current from the third bridge pattern 330 to the light emitting device OLED. In an exemplary embodiment, as shown in FIG. 7, the sixth bridge pattern 550 may be disposed to partially overlap the third bridge pattern 330, and may be in direct contact with and connected to the third bridge pattern 330 through an eleventh contact hole CNT11 defined through the fourth insulating layer 137 and the fifth insulating layer 139. The sixth bridge pattern 550 may be spaced apart from the upper initialization power line 510 and the driving voltage line 530.

The second conductive pattern 570 may be spaced apart from the upper initialization power line 510, the driving voltage line 530 and the sixth bridge pattern 550. The second conductive pattern 570 may be in direct contact with and connected to the first conductive pattern 340 through a twelfth contact hole CNT12 defined through the fourth insulating layer 137 and the fifth insulating layer 139. The second conductive pattern 570 is disposed to overlap the data line 400 disposed therebelow across the fifth insulating layer 139 to form a second capacitor Cpr. The second conductive pattern 570 defines the fourth capacitor electrode of the second capacitor Cpr, and a portion of the data line 400 overlapping therewith defines the third capacitor electrode of the second capacitor Cpr, and the fifth insulating layer 139 interposed therebetween may be a dielectric of the second capacitor Cpr. In such an embodiment, the first conductive pattern 340 and the second conductive pattern 570 may vertically overlap each other across the data line 400, so that the capacitance of the second capacitor Cpr may be maximized.

The fifth conductive layer 500 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W) and copper (Cu). The fifth conductive layer 500 may be a single film or a multi-layer film. In one embodiment, for example, the fifth conductive layer 500 may have a stacked structure of Ti/Al/Ti, Mo/Al/Mo, Mo/AlGe/Mo, and Ti/Cu.

In an exemplary embodiment, a sixth insulating layer 141 may be disposed on the fifth conductive layer 500. The sixth insulating layer 141 covers the fifth conductive layer 500. The sixth insulating layer 141 may be disposed generally over the entire surface of the substrate 100. In some embodiments, the sixth insulating layer 141 may be an organic insulating layer including an organic material. The organic material may include imide polymers, general-purpose polymers such as PMMA and PS, polymer derivatives having a phenolic group, acrylic polymers, arylether polymers, amide polymers, fluoropolymers, p-xylene-based polymers, vinyl alcohol-based polymers, and blends thereof.

In an exemplary embodiment, as shown in FIG. 7, a first device electrode 810 may be disposed on the sixth insulating layer 141. The first device electrode 810 may be an anode electrode of the light emitting device OLED. The first device electrode 810 may be connected to the sixth bridge pattern 550 through a thirteenth contact hole CNT13 defined through the sixth insulating layer 141. Accordingly, the first device electrode 810 may be electrically connected to the second electrode 151c of the first switching element T1 via the sixth bridge pattern 550 and the third bridge pattern 330.

In an exemplary embodiment, as shown in FIG. 7, a pixel defining layer 143 defining a light emitting region may be disposed on the sixth insulating layer 141 on which the first device electrode 810 is disposed, an opening exposing the upper surface of the first device electrode 810 is defined through the pixel defining layer 143. The pixel defining layer 143 may include an organic material such as PI or hexamethyldisiloxane ("HMDSO").

In an exemplary embodiment, a light emitting layer 830 may be located on the first device electrode 810 in a region surrounded by the pixel defining layer 143. In some embodiments, the light emitting layer 830 may include or be formed of a low molecular organic material or a polymer organic material such as Poly(3,4-ethylenedioxythiophene) ("PEDOT"). The light emitting layer 830 may be a multilayer film further including at least one of a hole injection layer ("HIL"), a hole transporting layer ("HTL"), an electron transporting layer ("ETL") and an electron injection layer. The second device electrode 850 may be disposed on the light emitting layer 830. In some embodiments, the second device electrode 850 may be a cathode electrode.

In such an embodiment, the first device electrode 810, the light emitting layer 830 and the second device electrode 850 collectively define a light emitting device OLED.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A display device comprising:
   an initialization power line extending along a first direction;
   a scan line extending along the first direction and spaced apart from the initialization power line in a second direction intersecting the first direction,
   a data line and a driving voltage line which are insulated from the initialization power line and the scan line, and extending along the second direction;
   a first switching element including a first electrode connected to the driving voltage line, a first gate electrode overlapping the initialization power line, and a second electrode;
   a second switching element including a third electrode connected to the first gate electrode, a second gate electrode connected to the scan line, and a fourth electrode;
   a third switching element including a fifth electrode connected to the fourth electrode, a third gate electrode connected to the initialization power line, and a sixth electrode connected to the second electrode; and
   a light emitting element electrically connected to the second electrode.

2. The display device of claim 1, wherein
   a first capacitor is defined between the first gate electrode and the initialization power line,
   wherein a portion of the initialization power line defines a first capacitor electrode of the first capacitor, and
   a portion of the first gate electrode defines a second capacitor electrode of the first capacitor.

3. The display device of claim 2, wherein a second capacitor is defined between the fourth electrode and the data line.

4. The display device of claim 3, wherein a capacitance of the second capacitor is larger than a capacitance of the first capacitor.

5. The display device of claim 3, wherein
   the fourth electrode is electrically connected to a first conductive pattern disposed on the fourth electrode through a contact hole,
   a portion of the data line defines a third capacitor electrode of the second capacitor, and
   a portion of the first conductive pattern defines a fourth capacitor electrode of the second capacitor.

6. The display device of claim 5, wherein the first conductive pattern is disposed on a layer between the fourth electrode and the data line.

7. The display device of claim 5, wherein
   the first conductive pattern is electrically connected to a second conductive pattern disposed on the data line through another contact hole,
   another portion of the data line defines the third capacitor electrode of the second capacitor, and
   a portion of the second conductive pattern defines the fourth capacitor electrode of the second capacitor.

8. The display device of claim 7, wherein the second conductive pattern is disposed on the data line.

9. The display device of claim 1, further comprising:
an upper initialization power line insulated from the scan line, extending along the second direction, and connected to the initialization power line,
wherein the upper initialization power line and the driving voltage line are disposed on a same layer, and comprise a same material as each other.

10. The display device of claim 9, wherein the upper initialization power line and the initialization power line are electrically connected to each other through a first bridge pattern and a contact hole disposed between the upper initialization power line and the initialization power line.

11. The display device of claim 1, wherein the first gate electrode of the first switching element is electrically connected to the third electrode of the second switching element through a second bridge pattern.

12. A display device comprising:
a substrate;
a semiconductor layer disposed on the substrate and including a first portion, a second portion and a third portion connecting the first portion and the second portion;
a first insulating layer disposed on the semiconductor layer;
a first conductive layer disposed on the first insulating layer and including a first gate electrode overlapping the first portion, a second gate electrode overlapping the second portion, and a third gate electrode overlapping the third portion;
a second insulating layer disposed on the first conductive layer; and
a second conductive layer disposed on the second insulating layer and including an initialization power line extending along a first direction and overlapping the first gate electrode and a scan line extending along the first direction and connected to the second gate electrode,
wherein the initialization power line and the third gate electrode are connected to each other.

13. The display device of claim 12, further comprising:
a third insulating layer disposed on the second conductive layer;
a third conductive layer disposed on the third insulating layer and including a first conductive pattern connected between the second portion and the third portion;
a fourth insulating layer disposed on the third conductive layer; and
a fourth conductive layer disposed on the fourth insulating layer and including a data line extending along a second direction perpendicular to the first direction and overlapping the first conductive pattern.

14. The display device of claim 13, further comprising:
a fifth insulating layer disposed on the fourth conductive layer; and
a fifth conductive layer disposed on the fifth insulating layer, extending along the second direction and including a driving voltage line connected to one side of the first portion.

15. The display device of claim 14, wherein the fifth insulating layer further includes an upper initialization power line extending along the second direction, spaced apart from the driving voltage line and connected to the initialization power line and the third gate electrode.

16. The display device of claim 15, wherein
the third conductive layer further includes a bridge pattern,
the bridge pattern is in direct contact with and connected to the third gate electrode and the initialization power line through a contact hole, and
the upper initialization power line is in direct contact with and connected to the bridge pattern through another contact hole.

17. The display device of claim 14, further comprising:
a sixth insulating layer disposed on the fifth conductive layer; and
a light emitting element disposed on the sixth insulating layer and connected to the other side of the first portion.

18. A display device comprising:
a first switching element including a first gate electrode connected to a first node, a first electrode connected to a driving voltage line to which a driving voltage is provided, and a second electrode connected to a third node;
a second switching element including a second gate electrode connected to a scan line, a third electrode connected to the first node and a fourth electrode connected to a second node;
a third switching element including a third gate electrode connected to an initialization power line to which initialization power is provided, a fifth electrode connected to the second node and a sixth electrode connected to the third node;
a light emitting element connected to the third node;
a first capacitor connected between the first node and the initialization power line; and
a second capacitor connected between the second node and a data line.

19. The display device of claim 18, wherein a capacitance of the second capacitor is larger than a capacitance of the first capacitor.

20. The display device of claim 18, wherein the first to third switching elements are p-type transistors.

* * * * *